United States Patent
Yamamoto et al.

(10) Patent No.: US 7,091,576 B2
(45) Date of Patent: Aug. 15, 2006

(54) INDUCTOR FOR SEMICONDUCTOR INTEGRATED CIRCUIT AND METHOD OF FABRICATING THE SAME

(75) Inventors: Ryota Yamamoto, Kanagawa (JP); Masayuki Furumiya, Kanagawa (JP); Hiroaki Ohkubo, Kanagawa (JP); Yasutaka Nakashiba, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 10/460,306

(22) Filed: Jun. 13, 2003

(65) Prior Publication Data

US 2003/0234437 A1    Dec. 25, 2003

(30) Foreign Application Priority Data

Jun. 18, 2002   (JP) ............................. 2002-177631

(51) Int. Cl.
*H01L 29/00*    (2006.01)
(52) U.S. Cl. ....................................... 257/531; 257/751
(58) Field of Classification Search ................ 257/531, 257/750–766; 438/238, 381
See application file for complete search history.

(56) References Cited

U.S. PATENT DOCUMENTS 6,180,445 B1 *   1/2001   Tsai ............................ 438/238

2003/0071326 A1 *   4/2003   Lin ............................ 257/531

FOREIGN PATENT DOCUMENTS

JP   2001-267320   9/2001

* cited by examiner

*Primary Examiner*—H. Jey Tsai
(74) *Attorney, Agent, or Firm*—McGinn IP Law Group PLLC

(57) ABSTRACT

Disclosed are an inductor for a semiconductor integrated circuit, which provides a wider cross-sectional area, significantly reduces the resistance to improve the Q value and has a highly uniform film thickness, and a method of fabricating the inductor. A spiral inductor is formed on a topmost interconnection layer of a multilayer interconnection layer formed by a damascene method. This inductor is formed by patterning a barrier metal layer on an insulation film, on which a topmost interconnection is formed, in such a way that the barrier metal layer contacts the topmost interconnection, then forming a protective insulation film on an entire surface of the barrier metal layer, forming an opening in that portion of the protective insulation film which lies over the barrier metal layer, forming a thick Cu film with the barrier metal layer serving as a plating electrode, and performing wet etching of the Cu film. This process can allow the inductor to be so formed as to be thick and have a wide line width.

1 Claim, 6 Drawing Sheets

INDUCTOR FOR SEMICONDUCTOR INTEGRATED CIRCUIT AND METHOD OF FABRICATING THE SAME

BACKGROUND OF THE INVENTION

1. Field of the Invention

The present invention relates to an inductor which is formed in a semiconductor integrated circuit and a method of fabricating the inductor.

2. Description of the Related Art

A conventional inductor provided in a semiconductor integrated circuit is formed on the same layer as the interconnection of the topmost layer of a multilayer interconnection formed by a damascene process (see Japanese Patent Laid-Open No. 2001-267320). FIG. 1 is a cross-sectional view of a semiconductor integrated circuit including a conventional inductor. Wells 2 and 3 are formed in the surface of a substrate 1, and a pair of high-concentration diffusion layers 6 of an MOS transistor and a low-concentration diffusion layer 7 lying between the diffusion layers 6 are formed in an area which is defined by device isolation regions 4 and 5 on the surface of the well 2. A gate insulation film 8 is formed on the substrate between the diffusion layers 6, and a gate electrode 9 and a side-wall insulation film 10 on the sides of the gate electrode 9 are formed on the gate insulation film 8. This provides an MOS transistor with an LDD (Lightly Doped Drain) structure.

A multilayer interconnection is formed on the substrate 1. Specifically, a first interlayer insulation film 11 is formed on the substrate 1, and a first interconnection layer 12 is formed on the first interlayer insulation film 11. The first interconnection layer 12 is formed by the following process. First, as shown in FIG. 2A, after a contact hole 21 is formed in the first interlayer insulation film 11, an insulation film 11a is formed on the first interlayer insulation film 11. Then, as shown in FIG. 2B, a groove 22a for an interconnection 22 is formed in the insulation film 11a by forming a resist pattern on the insulation film 11a by photolithography and then dry-etching the insulation film 11a with the resist pattern as a mask.

Next, as shown in FIG. 2C, a thin metal film 32 (TaN film or the like) to be a plating electrode is formed on the surface of the bottom and sides of the groove 22a for the interconnection 22 by sputtering or the like, and a barrier metal layer 23 is formed on the bottom of the groove 22a after which Cu is buried in the groove 22a for the interconnection 22 by plating Cu with the metal film 32 as a cathode. In this case, Cu is also deposited on the insulation film 11a.

Thereafter, as shown in FIG. 2D, Cu on the insulation film 11a is removed by CMP (Chemical Mechanical Polishing) to expose the insulation film 11a and planarize the surface of the insulation film 11a and the surface of the Cu buried in the interconnection groove 22a. As a result, a buried interconnection 22 is formed in the first interconnection layer 12.

Using the damascene method, likewise, a second interlayer insulation film 13 is formed on the insulation film 11a, a contact hole 24 is formed in the second interlayer insulation film 13, and an interconnection 25 of a second interconnection layer 14 is formed on an insulation film 13a formed on the second interlayer insulation film 13. Further, a third interlayer insulation film 15 is formed on the insulation film 13a, a contact hole 26 is formed in the third interlayer insulation film 15 and an interconnection 27 of a third interconnection layer 16 is formed on an insulation film 15a formed on the third interlayer insulation film 15. Furthermore, a fourth interlayer insulation film 17 is formed on the insulation film 15a, a contact hole 28 is formed in the fourth interlayer insulation film 17 and a topmost interconnection 29 of a topmost interconnection layer 18 is formed on an insulation film 17a formed on the fourth interlayer insulation film 17. The barrier metal layer 23 is also formed on the bottom of the topmost interconnection 29 and another barrier metal layer 31 is formed on the top of the topmost interconnection 29. A protective film 19 is formed on the entire surface of the resultant structure.

In a semiconductor integrated circuit which has the conventional inductor, therefore, the coil-like inductor 30 is formed simultaneously at the time of forming the topmost interconnection 29 of the topmost interconnection layer 18. That is, at the time of patterning the groove for the topmost interconnection 29 of the topmost interconnection layer 18 in the insulation film 17a by photolithography, the groove for the inductor 30 which is a coil-like interconnection is patterned simultaneously. Then, after a thin film for the plating electrode is formed by sputtering, the Cu film is formed by electrolytic plating in such a way as to be buried in that groove, then the surface is subjected to CMP to planarize the surface.

In the conventional semiconductor integrated circuit, the inductor 30 is formed together with the topmost interconnection 29 on the topmost interconnection layer 18 of the multilayer interconnection layer, formed by the damascene method, in the above-described manner.

Because the inductor 30 is formed at the same time as the topmost interconnection 29 by the damascene method in the conventional semiconductor integrated circuit, however, the thickness of the inductor 30 is limited by the thickness of the topmost interconnection layer 18. There is a limit to the thickness of the topmost interconnection layer 18 due to the restrictions on the fabrication process. As shown in FIG. 2D, "dishing", a phenomenon which produces a recess portion as the center of the surface of the interconnection is etched, occurs in the above-described CMP process in the damascene method. The wider the interconnection is, the more noticeable this "dishing" becomes. This puts some restriction on the width of the interconnection of the inductor 30.

Because of the restrictions on the interconnection width and the film thickness, the conventional inductor cannot have a large cross-sectional area. The conventional inductor disadvantageously has a high resistance which makes it difficult to improve the Q value that indicates the performance of the inductor.

Further, the surface, 33, of the interconnection 22 undergone CMP is recessed by dishing as shown in FIG. 2D, resulting in poor film planarization. Due to a variation in conditions for CMP, the uniformness of the film thickness of the inductor is poor, which is likely to cause a variation in the characteristics.

SUMMARY OF THE INVENTION

Accordingly, it is an object of the invention to provide an inductor for a semiconductor integrated circuit, which provides a wider cross-sectional area, significantly reduces the resistance to improve the Q value and has a highly uniform film thickness, and a method of fabricating the inductor.

An inductor for a semiconductor integrated circuit according to the invention comprises a substrate; an interconnection layer formed on the substrate by a damascene method; and an inductor formed by patterning a conductive layer laid on the interconnection layer.

In the inductor, for example, the conductive layer is, a copper layer or a copper alloy layer and the inductor is patterned by anisotropic etching of the conductive layer.

The anisotropic etching is, for example, wet etching. For example, the conductive layer is formed by plating. The inductor may further comprise a bonding pad formed outside the inductor by patterning the conductive layer.

Another inductor for a semiconductor integrated circuit according to the invention comprises a substrate; a plurality of interconnection layers provided on the substrate; a plurality of interlayer insulation films laid between the interconnection layers and between a topmost one of the interconnection layers and the substrate; and an inductor formed on the topmost interconnection layer. Each of the interconnection layers has a for-interconnection-layer insulation film and an interconnection formed by forming a groove in the for-interconnection-layer insulation film, then burying a conductive material in the groove and planarizing a surface of the for-interconnection-layer insulation film by chemical mechanical polishing. The inductor is formed by forming a conductive layer on the topmost interconnection layer via an insulation film and then patterning the conductive layer.

In the inductor, for example, the conductive layer is formed by plating and the conductive layer is a copper layer or a copper alloy layer.

The inductor is patterned by, for example, anisotropic etching and the anisotropic etching is, for example, wet etching.

The inductor may further comprise a bonding pad formed by patterning the conductive layer and is formed at the same time as the bonding pad.

The inductor may be connected to the topmost interconnection layer underlying the insulation film via an opening provided in the insulation film. The inductor may be constructed in such a way that the interconnection of the topmost interconnection layer is in contact with the inductor in a lengthwise direction thereof and the interconnection of the topmost interconnection layer functions, together with the inductor, as an inductance.

A method of fabricating an inductor for a semiconductor integrated circuit according to the invention comprises the steps of forming, on a substrate, a multilayer interconnection layer by a damascene method, which is formed by alternate lamination of interlayer insulation films each having a contact hole formed therein and interconnection layers each formed by burying a conductor in a for-interconnection-layer insulation film; forming a conductive layer on the multilayer interconnection layer; and forming an inductor by patterning the conductive layer in a spiral form by anisotropic etching.

In the method, the step of forming the conductive layer is, for example, a step of depositing a conductive layer by plating. The anisotropic etching may be wet etching.

In the step of forming the inductor, a bonding pad may be formed from the conductive layer at a same time.

DETAILED DESCRIPTION OF THE PREFERRED EMBODIMENTS

Figure 3:
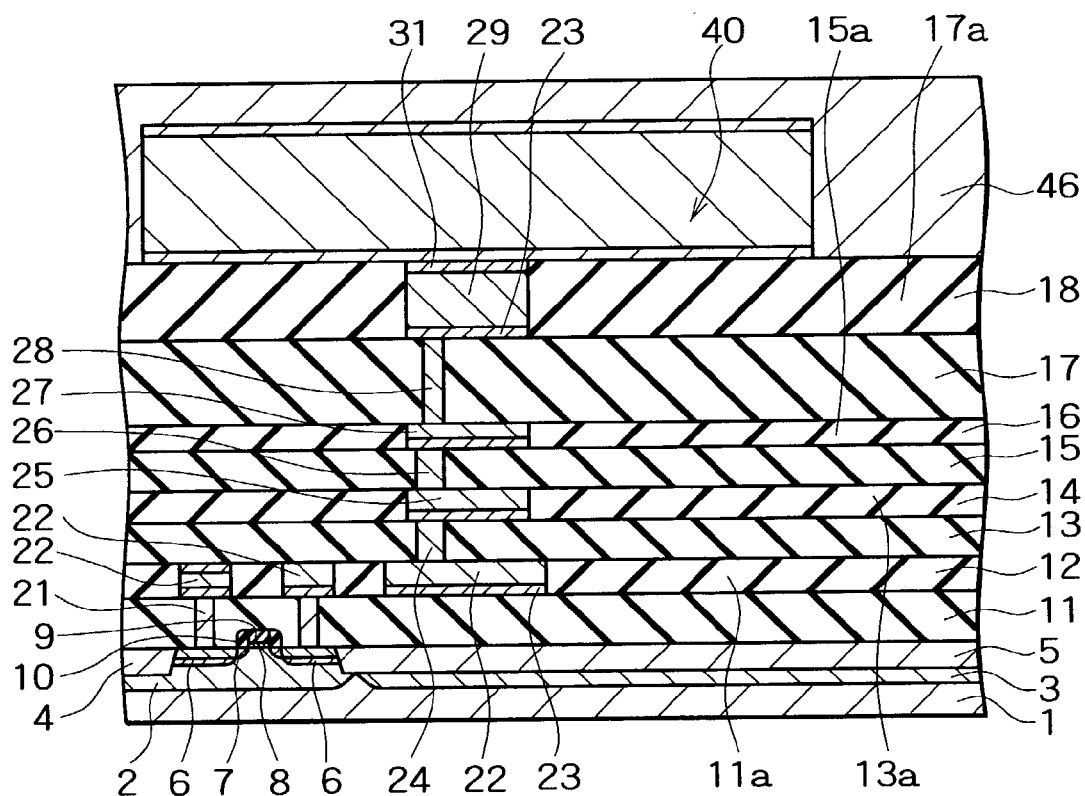
FIG. 3 is a cross-sectional view showing an inductor for a semiconductor integrated circuit according to a first embodiment of the invention.
Figure 4:
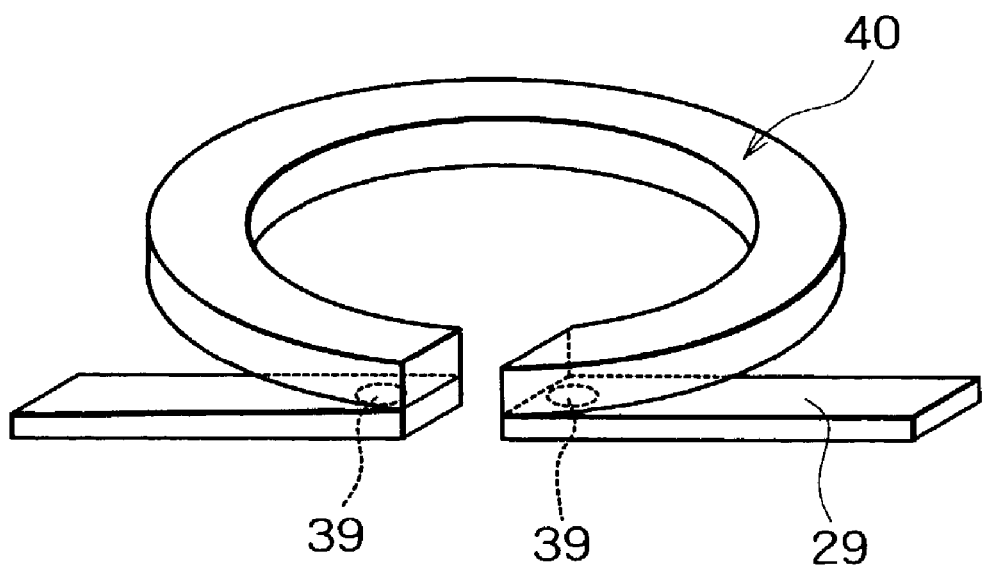
FIG. 4 is an exemplary perspective view showing the inductor portion.

Preferred embodiments of the invention will be described below with reference to the accompanying drawings. FIG. 3 is a cross-sectional view illustrating an inductor according to the first embodiment of the invention, FIG. 4 is a perspective view showing the inductor portion in enlargement, and FIGS. 5A through 5D are cross-sectional views showing the fabrication process for the inductor step by step. To avoid the redundant description, like or same reference symbols are given to those structural elements in FIG. 3 which are the same as the corresponding elements shown in FIG. 1.

Figure 1:
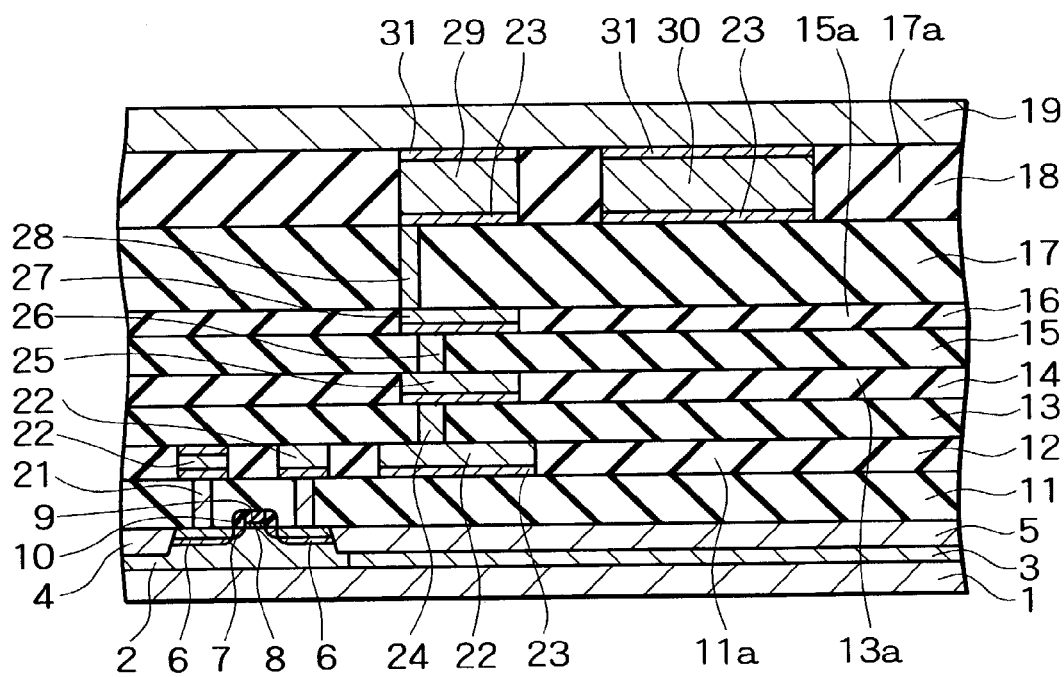
FIG. 1 is a cross-sectional view showing a conventional inductor for a semiconductor integrated circuit.
Figure 2A:
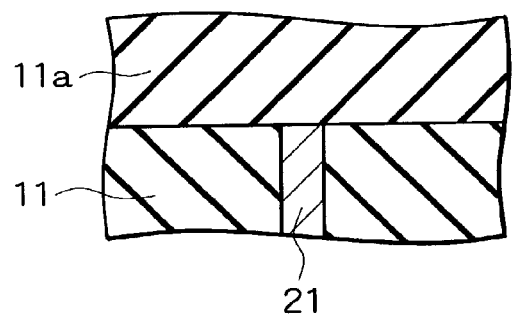
FIGS. 2A through 2D are cross-sectional views showing the process of forming the interconnections of the inductor (including the inductor) step by step.
Figure 2C:
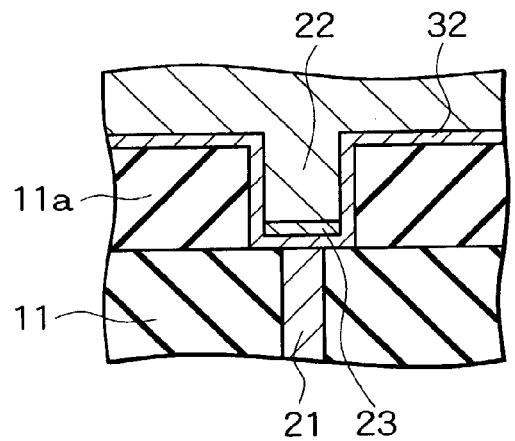
Figure 2B:
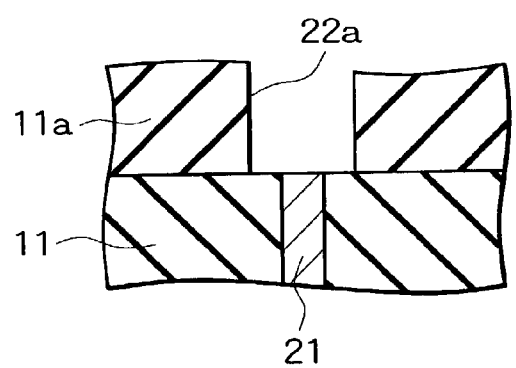
Figure 2D:
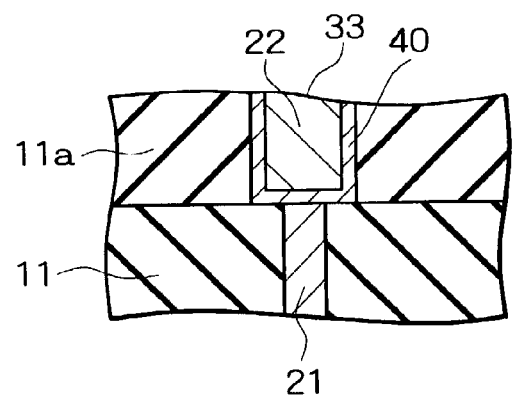

In FIG. 3, a multilayer interconnection is formed on a substrate 1 by the damascene method and the inductor in FIG. 3 is the same as the conventional inductor for a semiconductor integrated circuit shown in FIG. 1 up to a point where a contact hole 28 is formed in the fourth interlayer insulation film 17 which is the topmost layer as an interlayer insulation film. An insulation film 17a is formed on the fourth interlayer insulation film 17, a groove for a topmost interconnection 29 is patterned on the 17a by the damascene method, then the groove is plated and buried with Cu after which the surface of the resultant structure is planarized by CMP, thereby forming the interconnection 29. In the embodiment, the inductor is not formed on this topmost interconnection layer 18.

Figure 5A:
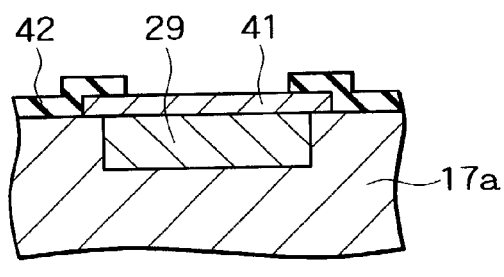
FIGS. 5A through 5D are cross-sectional views showing the fabrication process for the inductor step by step.

A spiral inductor 40 according to the embodiment is formed on the topmost interconnection layer 18. A method of forming the inductor 40 will be discussed next. First, as shown in FIG. 5A, a barrier metal layer 41 is patterned on the insulation film 17a, on which the topmost interconnection 29 is formed, in such a way as to contact the topmost interconnection 29, after which a protective insulation film 42 is formed on the entire surface of the resultant structure. Then, an opening is formed in a part of the protective insulation film 42 which lies over the barrier metal layer 41. As the barrier metal layer 41, for example, a TiN layer with a thickness of 2000 Angstroms should be formed. The protective insulation film 42 is, for example, an SiON layer with a thickness of 3000 Angstroms.

Figure 5B:
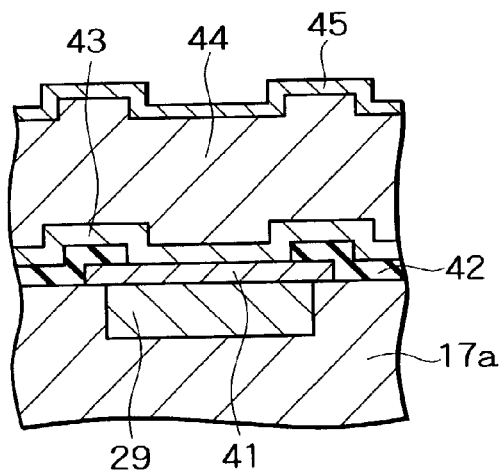

As shown in FIG. 5B, a barrier metal layer 43 is formed on the entire surface and a Cu film 44 is formed by electrolytic plating with the barrier metal layer 43 as a plating electrode. Then, a barrier metal layer 45 is formed on the Cu film 44. TiW layers which have thicknesses of 2000 Angstroms and 500 Angstroms should be formed as the barrier metal layers 43 and 45, respectively. The Cu film 44 has a thickness of, for example, 3 µm.

Figure 5C:
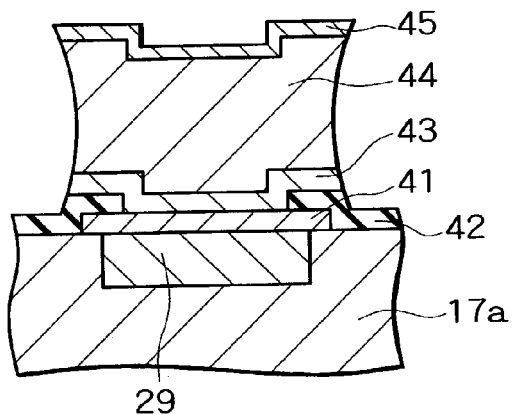

Then, as shown in FIG. 5C, a resist pattern (not shown) with the shape of the inductor is formed on the barrier metal layer 45 by photolithography and the spiral inductor 40 shown in FIG. 4 is formed by wet-etching the barrier metal layer 45, the Cu film 44 and the barrier metal layer 43 with the resist pattern as a mask. In this case, the inductor 40 is connected via a contact 39 to the topmost interconnection 29 formed on the topmost interconnection layer 18 underlying the inductor 40. The line width (resist width) of the inductor

40 is, for example, 10 mm. Therefore, the inductor 40 formed has a large cross-sectional area with a cross section of substantially 10 mm wide and 3 mm thick.

The same film as the Cu film which is formed, for example, at the time a bonding pad to be connected to a solder ball is provided on the topmost interconnection layer 18 of the multilayer interconnection that is conventionally formed by the damascene method may be used as the Cu film 44. Accordingly, the inductor 40 of the invention can be formed at the same time as the formation of the bonding pad, and on the same layer as the bonding pad is, by patterning the Cu film by wet etching.

A mixture of sulfuric acid and hydrogen peroxide can be used as an etching liquid in wet etching of the Cu film. In case where the barrier metal layer is a TiW film, it can be wet-etched with the sulfuric acid and hydrogen peroxide mixture.

Figure 5D:
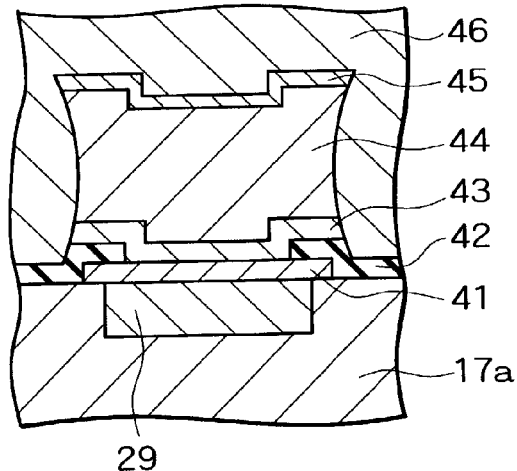

Next, as shown in FIG. 5D, the entire structure is covered with a cover film 46 of polyimide or the like, which completes the inductor for a semiconductor integrated circuit.

In the thus-constituted inductor for a semiconductor integrated circuit, the shape of the inductor is patterned by wet-etching the Cu film 44, so that there is no substantial restrictions on the film thickness and line width and an inductor having a very large cross-sectional area can be formed. This can reduce the resistance of the inductor, resulting in a higher Q value. Because the Cu film 44 is formed by wet etching in the embodiment, the sides of the interconnection of the acquired inductor 40 are dented like a drum as shown in FIG. 5C. This can increase the surface area of the inductor 40 as compared with the case where the sides of the interconnection are flat, and can thus reduce the skin effect originated from a high-frequency signal. This can also improve the Q value of the inductor. Unlike the conventional "dishing", the denting of the sides of the interconnection of the inductor does not adversely affect the planarization of the film.

Figure 6:
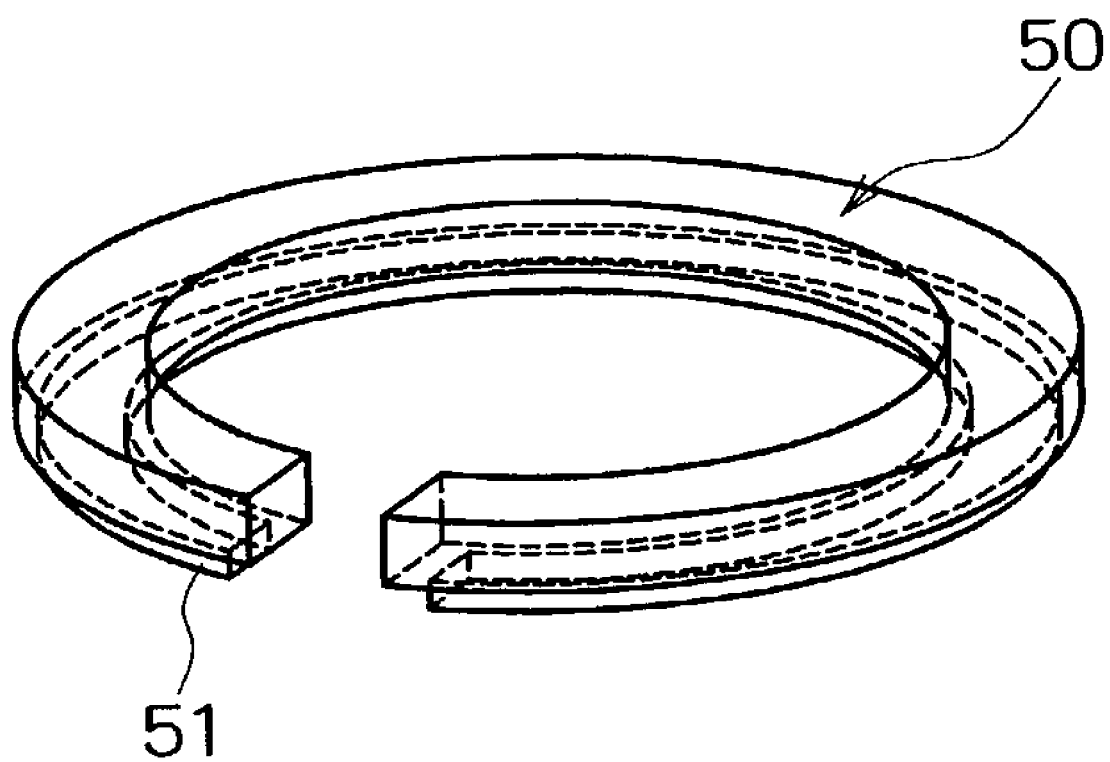
FIG. 6 is an exemplary perspective view showing the inductor portion of an inductor for a semiconductor integrated circuit according to a second embodiment of the invention.

The second embodiment of the invention, as shown in FIG. 6, will be discussed below. In the second embodiment, the shape of a topmost interconnection layer 51 which is formed on the topmost interconnection layer 18 underlying an inductor 50 is formed in a spiral form like the shape of the inductor 50. That is, the inductor 50 and the topmost interconnection layer 51 are laid out in such a way that a circle (part notched away) which passes the center of the interconnection width of the inductor 50 and a circle (part notched away) which passes the center of the interconnection width of the topmost interconnection layer 51 coincide with each other in a plan view.

Because the inductor 50 and the topmost interconnection layer 51 overlap each other in the thus-constituted inductor for a semiconductor integrated circuit and the topmost interconnection layer 51 serves as an inductor too, it is possible to further increase the cross-sectional area of the inductor. This can make the Q value of the inductor greater.

Although the inductor 40 or 50 is connected to the topmost interconnection of the multilayer interconnection which is formed by the damascene method in each embodiment discussed above, the invention is not limited to this particular structure but the inductor 40 or 50 may be connected to the topmost interconnection via a contact hole. Further, the inductor 40 or 50 may be connected to the topmost interconnection 29, formed on the topmost interconnection layer 18, or the underlying interconnection via a contact hole by providing an interlayer insulation film, not the insulation film 42, between the inductor 40 or 50 and the topmost interconnection layer 18 and forming the contact hole in that interlayer insulation film.

According to the invention, as described above, the inductor is provided on the (multilevel) interconnection layer formed by the damascene method (claim 1) or on the topmost interconnection layer in the (multilevel) interconnection layer (claim 6), so that the interconnection width and the interconnection thickness do not suffer restrictions and can be increased as needed, unlike in the conventional case where the inductor is formed on the topmost interconnection layer itself. This structure can considerably increase the cross-sectional area of the inductor as compared with the conventional inductor that is formed on the interconnection layer, making it possible to reduce the resistance of the inductor and increase the Q value thereof.

What is claimed is:

1. A semiconductor integrated circuit, comprising:
   a substrate;
   an interconnection layer formed on said substrate by a damascene method, and comprising at least one interconnection; and
   a conductive layer formed on said interconnection layer, said conductive layer including a pattern thereon to form an inductor, said inductor contacting said at least one interconnection,
   said conductive layer comprising:
      a first barrier layer formed on a top surface of said at least one interconnection;
      a lower protective film formed over said first barrier layer;
      a second barrier layer formed over said lower protective layer;
      a metal film formed over said second barrier layer; and
      an upper barrier layer formed on said metal film.

* * * * *